(12) United States Patent
Rokugawa et al.

(10) Patent No.: US 9,232,641 B2
(45) Date of Patent: Jan. 5, 2016

(54) WIRING BOARD AND METHOD OF MANUFACTURING THE SAME

(71) Applicant: SHINKO ELECTRIC INDUSTRIES CO., LTD., Nagano-shi, Nagano (JP)

(72) Inventors: Takahiro Rokugawa, Nagano (JP); Tomoyuki Shimodaira, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 105 days.

(21) Appl. No.: 13/902,197

(22) Filed: May 24, 2013

(65) Prior Publication Data

US 2013/0313010 A1  Nov. 28, 2013

(30) Foreign Application Priority Data

May 28, 2012 (JP) ................................ 2012-121194

(51) Int. Cl.
*H05K 1/11*   (2006.01)
*H05K 7/10*   (2006.01)
*H05K 1/02*   (2006.01)

(52) U.S. Cl.
CPC .................................. *H05K 1/0298* (2013.01)

(58) Field of Classification Search
CPC .................................................. H05K 1/0298
USPC ............................. 174/262–266; 361/767
See application file for complete search history.

(56) References Cited

U.S. PATENT DOCUMENTS

| 4,303,715 | A | * | 12/1981 | Chang | 428/137 |
|---|---|---|---|---|---|
| 5,028,743 | A | * | 7/1991 | Kawakami et al. | 174/264 |
| 5,319,159 | A | * | 6/1994 | Watanabe et al. | 174/262 |
| 2002/0160165 | A1 | * | 10/2002 | Matsuda | 428/209 |
| 2006/0021794 | A1 | * | 2/2006 | Cheng | 174/264 |
| 2009/0211799 | A1 | * | 8/2009 | Nagase et al. | 174/262 |
| 2010/0163297 | A1 | * | 7/2010 | Kajihara | 174/264 |
| 2010/0307807 | A1 | * | 12/2010 | Noda et al. | 174/264 |

FOREIGN PATENT DOCUMENTS

JP    2003-046248    2/2003

* cited by examiner

*Primary Examiner* — Sherman Ng
(74) *Attorney, Agent, or Firm* — Rankin, Hill & Clark LLP

(57) ABSTRACT

A wiring board includes a core layer, a through-hole penetrating through the core layer in its thickness direction, a first wiring layer formed on a first surface of the core layer, a through-hole wiring formed in the through-hole and electrically connected to the first wiring layer, and a curved first chamfered portion formed in a boundary portion between an inner side surface of the through-hole and the first surface of the core layer. The first wiring layer includes a first metal layer formed outside the first chamfered portion on the first surface of the core layer and a second metal layer formed on the first chamfered portion and the first metal layer.

5 Claims, 9 Drawing Sheets

WIRING BOARD AND METHOD OF MANUFACTURING THE SAME

CROSS-REFERENCE TO RELATED APPLICATION(S)

The present application claims the benefit of priority of Japanese Patent Application No. 2012-121194, filed on May 28, 2012. The disclosures of this application are incorporated herein by reference.

BACKGROUND

1. Technical Field

The present disclosure relates to a wiring board and a method of manufacturing the wiring board.

2. Related Art

There are wiring boards having wirings formed by filling, through-holes which penetrate through an insulating layer, with a plating material (hereinafter called as through-hole wirings). For example, such a wiring board is manufactured in the following manner. First, an insulating layer that is formed with copper foils on the two respective surfaces is prepared. Openings are formed through each copper foil by etching them so as to expose the respective surfaces of the insulating layer. Then, laser processing is performed on the exposed portions of the respective surfaces of the insulating layer through the openings, thereby forming through-holes each having a shape in which tapered shapes are connected by their narrower ends. Then, the through-holes are filled with the plating material.

PATENT DOCUMENTS

[Patent document 1] JP-A-2003-46248

However, the formation of openings through each copper foil by etching requires the following complicated process. Photosensitive resist layers are formed on copper foils formed on the two respective surfaces of an insulating layer and then exposed to light and developed, whereby the copper foils are exposed only in regions where openings are to be formed. Then, the exposed portions of the copper foils are etched away, whereby openings are formed through the copper foils. Finally, the resist layers are removed. Wiring boards which are manufactured by a process including such a complicated process have a problem that the manufacturing cost is high.

SUMMARY

Exemplary embodiments of the invention provide a wiring board and a method of manufacturing the wiring board which can reduce the manufacturing cost.

A wiring board according to an exemplary embodiment comprises:
  a core layer,
  a through-hole penetrating through the core layer in its thickness direction, a first wiring layer formed on a first surface of the core layer,
  a through-hole wiring formed in the through-hole and electrically connected to the first wiring layer, and
  a curved first chamfered portion formed in a boundary portion between an inner side surface of the through-hole and the first surface of the core layer,
    wherein the first wiring layer includes a first metal layer formed outside the first chamfered portion on the first surface of the core layer and a second metal layer formed on the first chamfered portion and the first metal layer.

A method of manufacturing a wiring board according to an exemplary embodiment, comprises:
  preparing a lamination plate which has a core layer and a first metal foil formed on a first surface of the core layer, and forming a through-hole which penetrates through the core layer and the first metal foil;
  removing a burr that projects from an end of the first metal foil toward the through-hole, and exposing a portion of the first surface of the core layer around an open end of the through-hole;
  after the portion is exposed, forming a metal layer in such a manner that the metal layer covers the first metal foil and fills the through-hole; and
  forming a first wiring layer on the first layer of the core layer by patterning the first metal foil and the metal layer.

According to the exemplary embodiments of the invention, it is possible to provide a wiring board and a method of manufacturing the wiring board which can reduce the manufacturing cost.

DETAILED DESCRIPTION

Figure 1A:
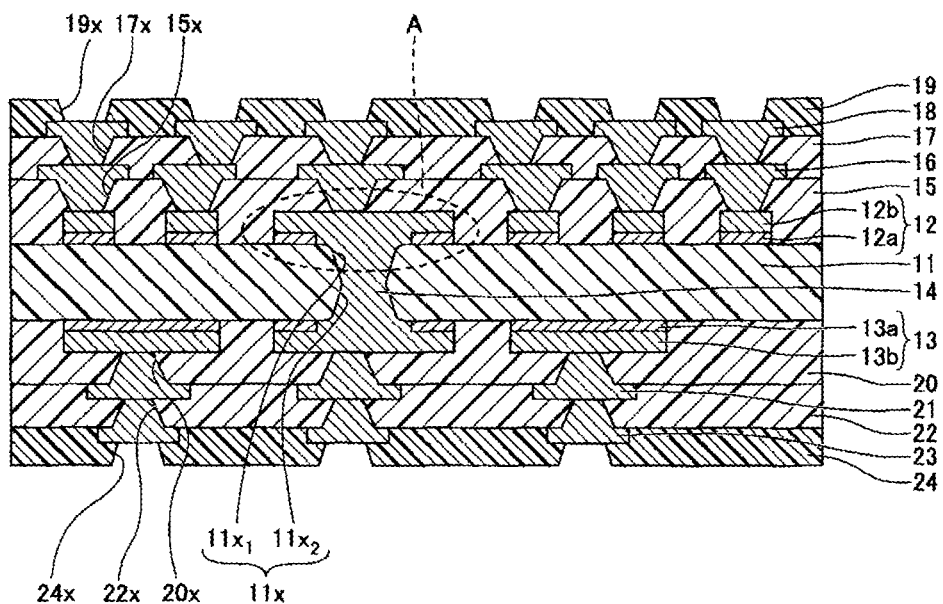
FIGS. 1A and 1B are sectional views illustrating a wiring board according to an embodiment.

Exemplary embodiments will be hereinafter described with reference to the drawings. The same items shown in the drawings are given the same reference symbol and may not be described redundantly.

Embodiment

Structure of Wiring Board According to Embodiment

Figure 1B:
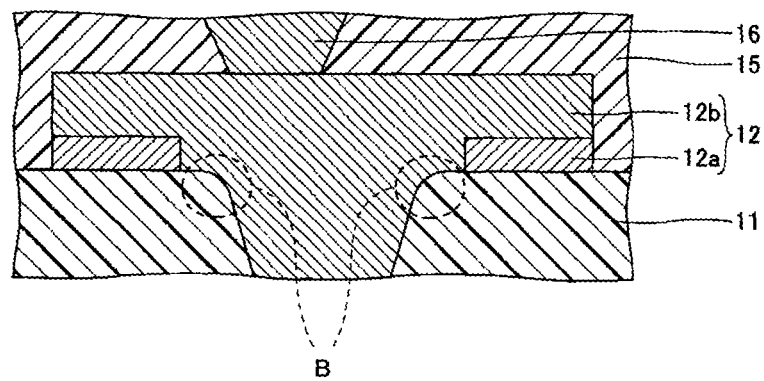
Figure 9:
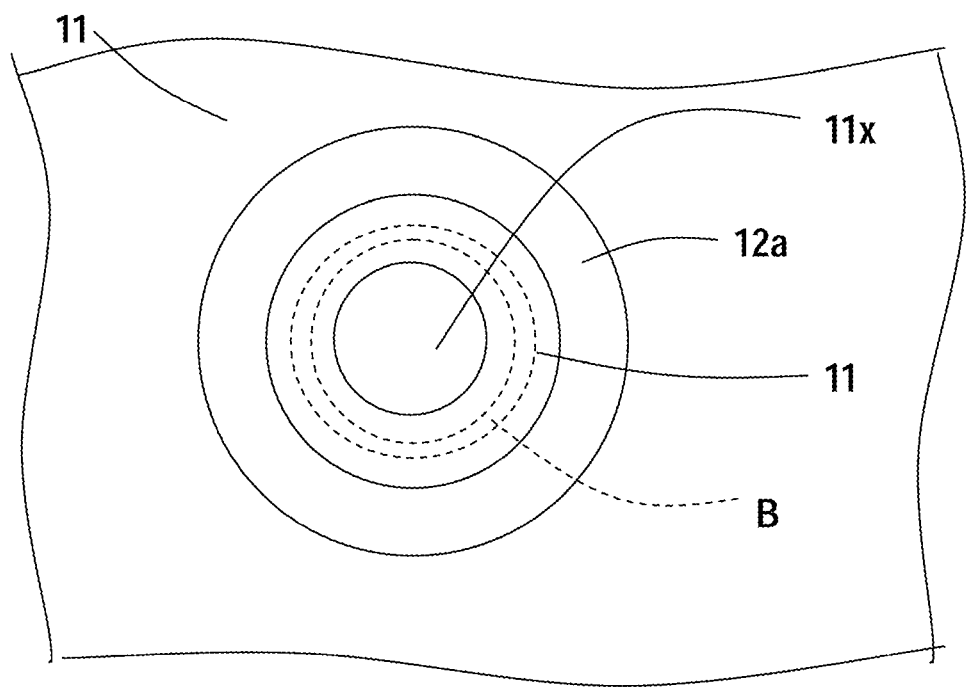
FIG. 9 is a view explaining shapes of a first chamfered portion and a first metal layer of the wiring board according to the embodiment.

First, a structure of a wiring board 10 according to an embodiment will be described. FIGS. 1A and 1B are sectional views illustrating the wiring board 10 according to the embodiment. FIG. 1B is an enlarged view of part A of FIG. 1A. FIG. 9 is a view explaining shapes of a first chamfered portion and a first metal layer of the wiring board 10 according to the embodiment. FIG. 9 is a plan view of the part A of FIG. 1A; however, a through-hole wiring, an insulating layer, a wiring layer and a second metal layer are omitted.

As shown in FIGS. 1A and 1B, the wiring board 10 according to the embodiment has a core layer 11, wiring layers 12 and 13, a through-hole wiring 14, an insulating layer 15, a wiring layer 16, an insulating layer 17, a wiring layer 18, a solder resist layer 19, an insulating layer 20, a wiring layer 21, an insulating layer 22, a wiring layer 23, and a solder resist layer 24.

In the wiring board 10, for the sake of convenience, the side (surface) on which the solder resist layer 19 is formed may be called a first side (surface) and the side (surface) on which the solder resist layer 24 is formed a second side (surface).

In the wiring board 10, the wiring layer 12 is formed on the first surface of the core layer 11 and the wiring layer 13 is formed on the second surface of the core layer 11. The wiring layers 12 and 13 are electrically connected to each other by the through-hole wiring 14 which is formed in a through-hole $11x$ which penetrates through the core layer 11 in its thickness direction. Each of the wiring layers 12 and 13 is patterned so as to have a prescribed planar pattern.

The core layer 11 may be what is called a glass epoxy substrate in which an epoxy resin is impregnated in glass cloth. Alternatively, the core layer 11 may be a board in which an epoxy resin, for example, is impregnated in woven cloth or nonwoven cloth made of glass fiber, carbon fiber, aramid fiber, or the like. The core layer 11 may be about 60 to 400 μm, for example, in thickness. The through-hole $11x$ penetrates through the core layer 11 in its thickness direction.

The through-hole $11x$ has a first hole $11x_1$ which was formed from the first surface of the core layer 11 and a second hole $11x_2$ which was formed from the second surface of the core layer 11. The first hole $11x_1$ is a truncated-cone-shaped hole in which the area of its open end located on the side of the first surface is larger than the area of its narrower end located in the core layer 11. The second hole $11x_2$ is a truncated-cone-shaped hole in which the area of its open end located on the side of the second surface is larger than that of its narrower end located in the core layer 11. The through-hole $11x$ is formed in such a manner that the narrower ends of the first hole $11x_1$ and second hole $11x_2$ are connected to each other inside the core layer 11 (e.g., at the center or in the vicinity of the center of the core layer 11 in its thickness direction). The portion of the through-hole $11x$ where the narrower ends of the first hole $11x_1$ and second hole $11x_2$ are connected to each other may be referred to as a narrower ends connecting portion.

In other words, the through-hole $11x$ has a hand drum shape which means a shape in which the area of the cross section taken parallel with the surfaces of the core layer 11 decreases continuously as the position goes from each of the first-side open end and the second-side open end of the through-hole $11x$ to the narrower ends connecting portion. The narrower ends connecting portion is the portion (smallest diameter portion) where the sectional area of the through-hole $11x$ is smallest.

Thus, in a sectional view taken parallel with the thickness direction of the core layer 11, the through-hole $11x$ has slant lines that extend from the first-side open end of the through-hole $11x$ to its smallest diameter portion (narrower ends connecting portion) which is located approximately at the center of the through-hole $11x$ and slant lines that extend from the second-side open end of the through-hole $11x$ to its smallest diameter portion.

In the through-hole $11x$, the diameters of the first-side open end and the second-side open end of the through-hole $11x$ may each be set at about 60 to 200 μm, for example. The diameter of the narrower ends connecting portion may be set at about 30 to 150 μm, for example.

Each of the first hole $11x_1$ and the second hole $11x_2$ may have a shape other than a truncated cone. In this case, the first-side open end, the second-side open end, and the narrower ends connecting portion of the through-hole $11x$ each have an elliptical or some other sectional shape (in a sectional view taken parallel with the surfaces of the core layer 11).

The narrower ends connecting portion may be deviated to the first side or the second side from the vicinity of the center of the through-hole $11x$ in the thickness direction of the core layer 11. That is, no problems arise even if the narrower ends connecting portion is deviated to some extent in the vertical direction from the vicinity of the center of the through-hole $11x$ in the thickness direction of the core layer 11. No problems arise even if the axes of the first hole $11x_1$ and the second hole $11x_2$ are deviated from each other to some extent in the horizontal direction.

In the through-hole $11x$, the lines representing the inner side surface of each of the first hole $11x_1$ and the second hole $11x_2$ in a sectional view taken parallel with the thickness direction of the core layer 11 may be either straight or curved.

As shown in parts B of FIG. 1B and FIG. 9, a curved chamfered portion (may be referred to as a first chamfered portion) is formed in ring form in a boundary portion between the inner side surface of the first hole $11x_1$ and the first surface of the core layer 11. Likewise, a curved chamfered portion (may be referred to as a second chamfered portion; not shown in FIG. 1B (opposite to parts B)) is formed in ring form in a boundary portion between the inner side surface of the second hole $11x_2$ and the second surface of the core layer 11. In a sectional view taken parallel with the thickness direction of the core layer 11, each of the first chamfered portion and the second chamfered portion has a rounded convex shape, for example.

Consideration will now be given to a hypothetical case that neither the first chamfered portion nor the second chamfered portion is formed, that is, the inner side surface of the through-hole $11x$ and the first surface of the core layer 11 have an angled boundary and the inner side surface of the through-hole $11x$ and the second surface of the core layer 11 also have an angled boundary. In this case, a crack may develop in the wiring layer 12 or 13 or the through-hole wiring 14 due to stress concentration from the angled portion(s). In that event, the wiring layer 12 or 13 or the through-hole wiring 14 may be disconnected starting from the crack.

In contrast, in the embodiment, since the first and second chamfered portions are formed, stress concentration from the first or second chamfered portion is not prone to occur and hence the probability of occurrence of a crack in the wiring layer 12 or 13 or the through-hole wiring 14 is low. As a result, the probability of occurrence of an event that the wiring layer 12 or 13 or the through-hole wiring 14 is disconnected starting from a crack is low.

The wiring layer 12 has a first metal layer 12a and a second metal layer 12b, which may be made of copper (Cu), for example. Likewise, the wiring layer 13 has a third metal layer 13a and a fourth metal layer 13b, which may be made of copper (Cu), for example. The wiring layers 12 and 13 are typical examples of terms "first wiring layer" and "second wiring layer," respectively, as used in the claims.

The through-hole wiring 14 may be made of copper (Cu), for example. The second metal layer 12b of the wiring layer 12, the fourth metal layer 13b of the wiring layer 13, and the through-hole wiring 14 which are electrically connected to each other are integrally formed with each other. However, for the sake of convenience, the embodiment is described in such a manner that the portion, formed in the through-hole $11x$, of the above integral structure is regarded as the through-hole wiring 14, the portion, formed on the side of the insulating layer 15, of the integral structure is regarded as the second metal layer 12b, and the portion, formed on the side of the insulating layer 20, of the integral structure is regarded as the fourth metal layer 13b.

Although as mentioned above the wiring layer 12 has the first metal layer 12a and the second metal layer 12b, no portion of the first metal layer 12a is formed immediately around the first-side open end of the through-hole 11x. Likewise, although the wiring layer 13 has the third metal layer 13a and the fourth metal layer 13b, no portion of the third metal layer 13a is formed immediately around the second-side open end of the through-hole 11x.

That is, as shown in part A of FIG. 1A, no portion of the first metal layer 12a is formed on the first chamfered portion and the first metal layer 12a is formed in ring form (See FIG. 9), around the first chamfered portion, of the first surface of the core layer 11. The second metal layer 12b is formed on the first chamfered portion, the first metal layer 12a, and the through-hole wiring 14. The portions of the second metal layer 12b which are not shown in part A of FIG. 1A are formed on the corresponding portions of first metal layer 12a.

Likewise, in a region located on the opposite side of the through-hole 11x to part A and opposed to part A, no portion of the third metal layer 13a is formed on the second chamfered portion and the third metal layer 13a is formed in ring form, around the second chamfered portion, of the second surface of the core layer 11. The fourth metal layer 13b is formed on the second chamfered portion, the third metal layer 13a, and the through-hole wiring 14. The portions of the fourth metal layer 13b which are not in the region located on the opposite side of the through-hole 11x to part A and opposed to part A are formed on the corresponding portions of the third metal layer 13a.

The insulating layer 15 is formed on the first surface of the core layer 11 so as to cover the wiring layer 12. The insulating layer 15 may be made of an insulative resin having an epoxy resin as the main component. The insulating layer 15 may contain a filler such as silica ($SiO_2$). The insulating layer 15 may be about 15 to 35 μm, for example, in thickness.

The wiring layer 16 is formed on the first side of the insulating layer 15. The wiring layer 16 includes a plurality of vias that fill respective via holes 15x that penetrate through the insulating layer 15 and expose respective portions of the first surface of the wiring layer 12 and wiring patterns formed on the first surface of the insulating layer 15. Each via hole 15x is a truncated-cone-shaped recess which has an open end on the side of the insulating layer 17, whose narrower end is defined by the first surface of the wiring layer 12, and in which the area of its open end is larger than that of its narrower end. The wiring layer 16 may be made of copper (Cu), for example, and may be about 10 to 30 μm, for example, in thickness.

The insulating layer 17 is formed on the first surface of the insulating layer 15 so as to cover the wiring layer 16. The material and the thickness of the insulating layer 17 may be the same as those of the insulating layer 15. The insulating layer 17 may contain a filler such as silica ($SiO_2$).

The wiring layer 18 is formed on the first side of the insulating layer 17. The wiring layer 18 includes a plurality of vias that fill respective via holes 17x that penetrate through the insulating layer 17 and expose respective portions of the first surface of the wiring layer 16 and wiring patterns formed on the first surface of the insulating layer 17. Each via hole 17x is a truncated-cone-shaped recess which has an open end on the side of the solder resist layer 19, whose narrower end is defined by the first surface of the wiring layer 16, and in which the area of its open end is larger than that of its narrower end. The material and the thickness of the wiring layer 18 may be the same as those of the wiring layer 16.

The solder resist layer 19 is formed on the first surface of the insulating layer 17 so as to cover the wiring layer 18. The solder resist layer 19 may be made of a photosensitive resin, for example, and may be about 15 to 35 μm, for example, in thickness.

The solder resist layer 19 has openings 19x and corresponding portions of the wiring layer 18 are partially exposed in the respective openings 19x. The partially exposed portions of the wiring layer 18 function as pads to be electrically connected to a semiconductor chip or the like (not shown), and hence may be referred to as first pads 18.

Alternatively, the openings 19x of the solder resist layer 19 may be formed so as to completely expose the corresponding portions of the wiring layer 18. In this case, the openings 19x of the solder resist layer 19 may be formed so that the side surfaces of the wiring layer 18 are either in contact with the inner side surfaces of the openings 19x or spaced from the inner side surfaces of the openings 19x.

If necessary, a metal layer or an antioxidation treatment such as an OSP (organic solderability preservative) treatment may be formed or performed on the first surface of each first pad 18. Examples of the metal layer are an Au layer, an Ni/Au layer (i.e., a metal layer formed by providing an Ni layer and an Au layer in this order), and an Ni/Pd/Au layer (i.e., a metal layer formed by providing an Ni layer, a Pd layer, and an Au layer in this order). The metal layer may be about 0.03 to 10 μm, for example, in thickness. External connection terminals such as solder balls or lead pins may be formed on the first surfaces of the first pads 18.

Part of the wiring patterns of the wiring layer 18 may extended to the first surface of the insulating layer 17 and openings 19x may be formed on wiring patterns thus formed on the first surface of the insulating layer 17. That is, openings 19x may also be formed at locations other than over the via holes 17x.

The insulating layer 20 is formed on the second surface of the core layer 11 so as to cover the wiring layer 13. The material and the thickness of the insulating layer 20 may be the same as those of the insulating layer 15. The insulating layer 20 may contain a filler such as silica ($SiO_2$).

The wiring layer 21 is formed on the second side of the insulating layer 20. The wiring layer 21 includes a plurality of vias that fill respective via holes 20x that penetrate through the insulating layer 20 and expose respective portions of the second surface of the wiring layer 13 and wiring patterns formed on the second surface of the insulating layer 20. Each via hole 20x is a truncated-cone-shaped recess which has an open end on the side of the insulating layer 22, whose narrower end is defined by the second surface of the wiring layer 13, and in which the area of its open end is larger than that of its narrower end. The material and the thickness of the wiring layer 21 may be the same as those of the wiring layer 16.

The insulating layer 22 is formed on the second surface of the insulating layer 20 so as to cover the wiring layer 21. The material and the thickness of the insulating layer 22 may be the same as those of the insulating layer 15. The insulating layer 22 may contain a filler such as silica ($SiO_2$).

The wiring layer 23 is formed on the second side of the insulating layer 22. The wiring layer 23 includes a plurality of vias that fill respective via holes 22x that penetrate through the insulating layer 22 and expose respective portions of the second surface of the wiring layer 21 and wiring patterns formed on the second surface of the insulating layer 22. Each via hole 22x is a truncated-cone-shaped recess which has an open end on the side of the solder resist layer 24, whose narrower end is defined by the second surface of the wiring layer 21, and in which the area of its open end is larger than that of its narrower end. The material and the thickness of the wiring layer 23 may be the same as those of the wiring layer 16.

The solder resist layer 24 is formed on the second surface of the insulating layer 22 so as to cover the wiring layer 23. The material and the thickness of the solder resist layer 24 may be the same as those of the solder resist layer 19.

The solder resist layer 24 has openings $24x$ and corresponding portions of the wiring layer 23 are partially exposed in the respective openings $24x$. The partially exposed portions of the wiring layer 23 function as pads to be electrically connected to a semiconductor chip or the like (not shown), and hence may be referred to as second pads 23.

If necessary, a metal layer or an antioxidation treatment such as an OSP (organic solderability preservative) treatment may be formed or performed on the second surface of each second pad 23. Examples of the metal layer are an Au layer, an Ni/Au layer (i.e., a metal layer formed by providing an Ni layer and an Au layer in this order), and an Ni/Pd/Au layer (i.e., a metal layer formed by providing an Ni layer, a Pd layer, and an Au layer in this order). The metal layer may be about 0.03 to 10 µm, for example, in thickness. External connection terminals such as solder balls or lead pins may be formed on the second surfaces of the second pads 23.

Part of the wiring patterns of the wiring layer 23 may extended to the second surface of the insulating layer 22 and openings $24x$ may be formed on wiring patterns thus formed on the second surface of the insulating layer 22. That is, openings $24x$ may also be formed at locations other than under the via holes $22x$.

Manufacturing Method of Wiring Board According to Embodiment

Next, a manufacturing method the wiring board 10 according to the embodiment will be described. FIGS. 2A-2C to FIGS. 5A-5C illustrate a manufacturing process of the wiring board 10 according to the embodiment.

Figure 2A:
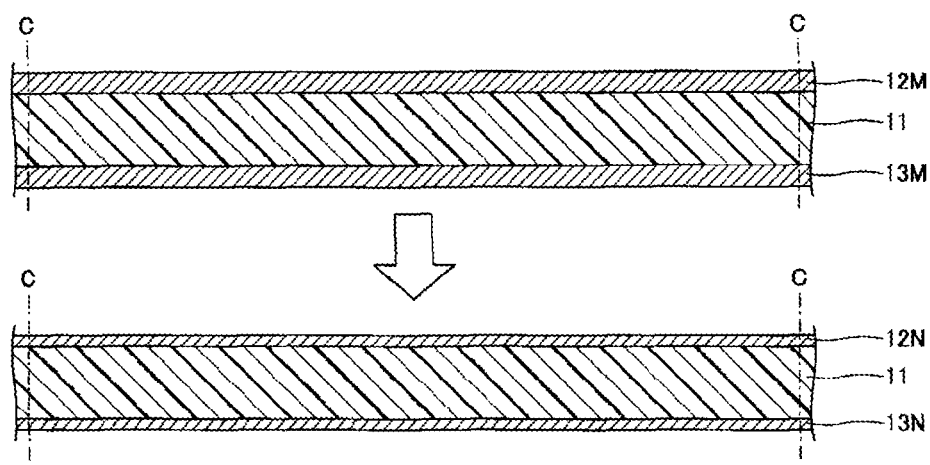
FIGS. 2A-2C are a first set of drawings illustrating a manufacturing process of the wiring board according to the embodiment.

First, in a step shown in FIG. 2A, a lamination plate is prepared in which a first metal foil 12M and a second metal foil 13M (unpatterned, plain metal foils) are formed on the first surface and the second surface of a core layer 11, respectively.

The core layer 11 may be what is called a glass epoxy substrate in which an epoxy resin is impregnated in glass cloth. The core layer 11 may be about 60 to 400 µm, for example, in thickness. Each of the first metal foil 12M and the second metal foil 13M may be a copper foil, for example, and about 12 to 18 µm, for example, in thickness.

The first metal foil 12M and the second metal foil 13M of the thus-prepared lamination plate are thinned by etching. For the sake of convenience, thinned versions of the first metal foil 12M and the second metal foil 13M are called a first metal foil 12N and a second metal foil 13N, respectively. The first metal foil 12N and the second metal foil 13N may each be about 3 to 8 µm, for example, in thickness. Where the first metal foil 12M and the second metal foil 13M are copper foils, they can be thinned using, for example, a sulfuric acid hydrogen peroxide mixture-based etching liquid or a chlorine persulfate-based etching liquid.

The purposes of thinning the first metal foil 12M and the second metal foil 13M into the first metal foil 12N and the second metal foil 13N is to facilitate later laser processing and to reduce the sizes of burrs that will be formed at processing end portions of the first metal foil 12N and the second metal foil 13N in the laser processing. The first metal foil 12N and the second metal foil 13N are to become a first metal layer $12a$ and a third metal layer $13a$, respectively, when patterned in a later step.

Figure 2B:
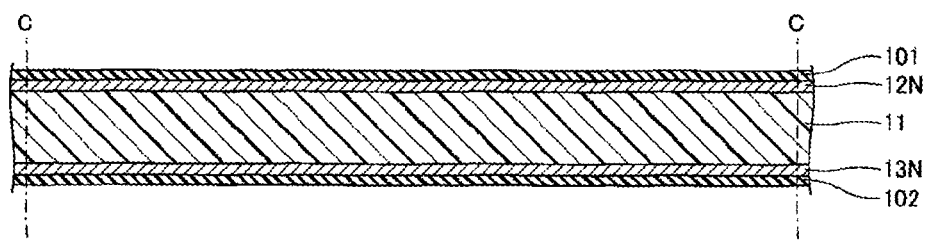

Then, in a step shown in FIG. 2B, surface-treated layers 101 and 102 are formed by performing a surface treatment on the first surface of the first metal foil 12N and the second surface of the second metal foil 13N, respectively. An example of the surface treatment is blackening, which is a treatment of oxidizing the surface of a metal foil using sodium chlorite or the like. Blackening is a kind of roughening.

An oxide film which is minute asperities of about 1 µm are formed by blackening in each of the first surface of the first metal foil 12N and the second surface of the second metal foil 13N. That is, a roughed surface is formed as an oxide film in each of the first surface of the first metal foil 12N and the second surface of the second metal foil 13N. The oxide films (roughed surfaces) which are surface-treated layers 101 and 102 look black or brown.

The black or brown surface-treated layers 101 and 102 are apt to absorb laser light having a certain wavelength which will be applied to them in a later step, and hence serve to enhance the processing performance of the laser processing. The surface-treated layers 101 and 102 may be formed by processing other than blackening as long as it facilitates absorption of laser light.

Figure 2C:
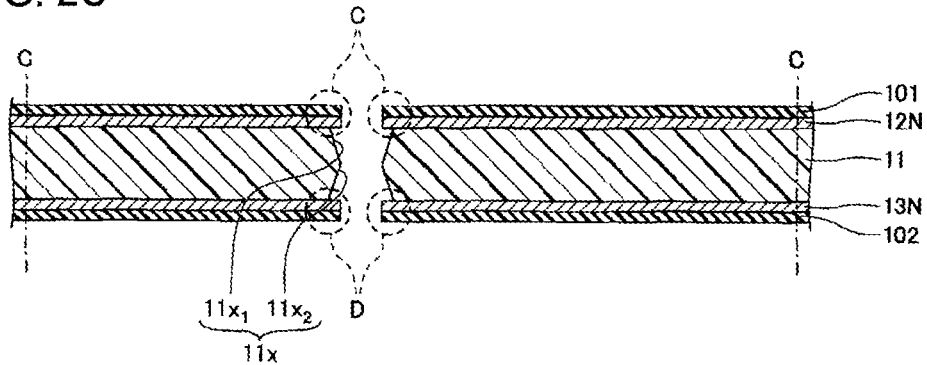

Then, in a step shown in FIG. 2C, a through-hole $11x$ is formed by laser processing using a $CO_2$ laser, for example, so that it penetrates through the core layer 11, the first metal foil 12N and the second metal foil 13N, and the surface-treated layers 101 and 102. Although $CO_2$ lasers emit laser light in an infrared wavelength range, the black or brown surface-treated layers 101 and 102 can still enhance the processing performance of the laser processing because they absorb light in a broad wavelength range including ultraviolet light, visible light, and infrared light.

The through-hole $11x$ is formed in the following manner. First, a first hole $11x_1$ is formed on the first side of the core layer 11 by applying laser light to the core layer 11 from its first side through the surface-treated layer 101 and the first metal foil 12N. Then, a second hole $11x_2$ is formed on the second side of the core layer 11 by applying laser light to the core layer 11 from its second side through the surface-treated layer 102 and the second metal foil 13N. As a result, the narrower ends of the first hole $11x_1$ and the second hole $11x_2$ are connected to each other at the center or in the vicinity of the center of the core layer 11 in its thickness direction, whereby a hand-drum-shaped through-hole $11x$ is formed. It is noted that the first hole $11x_1$ need not always penetrate through the core layer 11 as long as the through-hole $11x$ is formed finally.

The first hole $11x_1$ is a truncated-cone-shaped hole in which the area of its open end on the side of the first surface of the core layer 11 is larger than its narrower end which is located in the core layer 11, and the second hole $11x_2$ is a truncated-cone-shaped hole in which the area of its open end on the side of the second surface of the core layer 11 is larger than its narrower end which is located in the core layer 11. Thus, the through-hole $11x$ is shaped like a hand drum.

Each of the first hole $11x_1$ and the second hole $11x_2$ need not always be a truncated-cone-shaped hole. Where each of the first hole $11x_1$ and the second hole $11x_2$ is not a truncated-cone-shaped hole, the first-side open end, the second-side open end, and the narrower ends connecting portion of the through-hole $11x$ each have an elliptical or some other sectional shape (in a sectional view taken parallel with the surfaces of the core layer 11). The narrower ends connecting portion may be deviated to the first side or the second side from the vicinity of the center of the through-hole 11x in the thickness direction of the core layer 11.

The sectional shape (in a sectional view taken parallel with the thickness direction of the core layer 11) of each of the first hole $11x_1$ and the second hole $11x_2$ of the through-hole 11x may be either straight or curved.

When the through-hole 11x is formed by laser processing, as shown in parts C of FIG. 2C, burrs project inward like a visor from the ends of the surface-treated layer 101 and the first metal foil 12N at the first-side open end of the through-hole 11x. Likewise, as shown in parts D of FIG. 2C, burrs project inward like a visor from the ends of the surface-treated layer 102 and the second metal foil 13N at the second-side open end of the through-hole 11x. Burrs may be formed in such a manner that their end portions are bent or laser-light-melted fragments of the first metal foil 12N or the second metal foil 13N stick to their end portions.

Figure 3A:
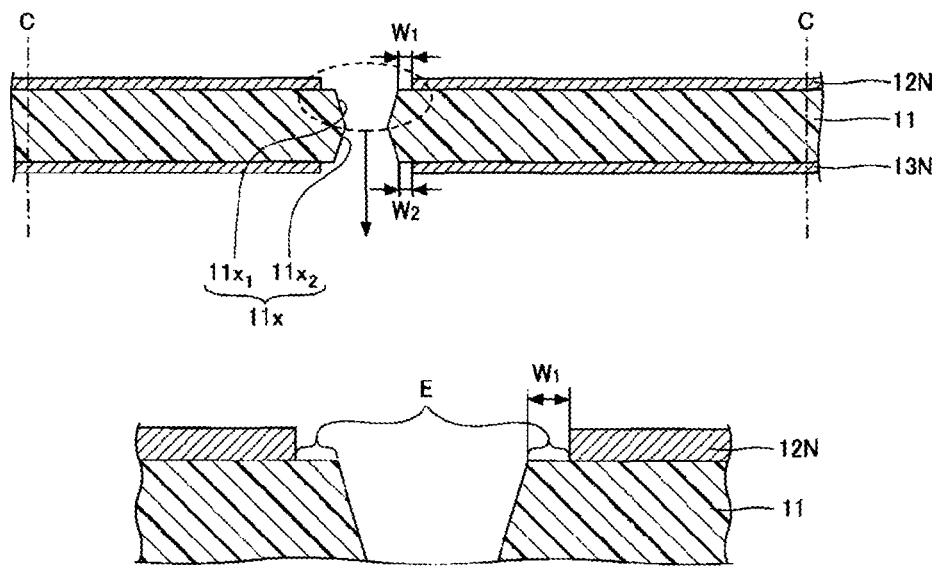
FIGS. 3A and 3B are a second set of drawings illustrating a manufacturing process of the wiring board according to the embodiment.

Then, in a step shown in FIG. 3A, the burrs shown in parts C and D of FIG. 2C are removed. The burrs can be removed by etching using, for example, a sulfuric acid hydrogen peroxide mixture-based etching liquid or a chlorine persulfate-based etching liquid. Instead of etching, the burrs can be removed by buff polishing, blasting, cleaning by high-pressure spraying, or the like. The burrs can be removed easily because the first metal foil 12N or the second metal foil 13N were thinned in the step shown in FIG. 2A.

FIG. 3A shows a burrs-removed structure in which a ring-shaped portion, around the first-side open end of the through-hole 11x, of the first metal foil 12N is removed together with the burrs and a corresponding ring-shaped portion of the first surface of the core layer 11 is exposed (indicated by character E in FIG. 3A; this portion will be referred to as a ring-shaped exposed portion of the first surface). Likewise, a ring-shaped portion, around the second-side open end of the through-hole 11x, of the second metal foil 13N is removed together with the burrs and a corresponding ring-shaped portion of the second surface of the core layer 11 is exposed (this portion will be referred to as a ring-shaped exposed portion of the second surface).

The width $W_1$ of the ring-shaped exposed portion of the first surface can be made equal to about 10 μm, for example. Likewise, the width $W_2$ of the ring-shaped exposed portion of the second surface can be made equal to about 10 μm, for example. Since the burrs can be removed without, for example, masking both surfaces of the structure shown in FIG. 2C, the surface-treated layers 101 and 102 are removed together with the burrs.

Figure 3B:
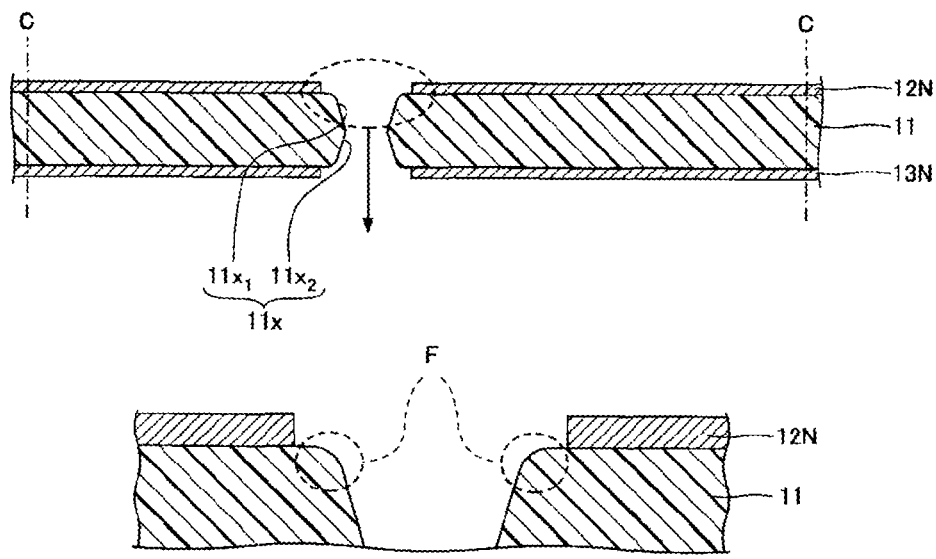

Then, in a step shown in FIG. 3B, desmearing is performed to remove resin residues that originate from the core layer 11 and stick to the inner side surface of the through-hole 11x. During that course, a boundary portion between the inner side surface of the through-hole 11x and the first surface of the core layer 11, that is, a portion inside the ring-shaped exposed portion of the first surface of the core layer 11, is dissolved. As a result, the boundary portion between the inner side surface of the through-hole 11x and the first surface of the core layer 11 is chamfered so as to have a curved shape. Thus, as shown in parts F of FIG. 3B, a ring-shaped first chamfered portion is formed. For example, the first chamfered portion has a rounded convex shape in a sectional view taken parallel with the thickness direction of the core layer 11.

Likewise, a boundary portion between the inner side surface of the through-hole 11x and the second surface of the core layer 11, that is, a portion inside the ring-shaped exposed portion of the second surface of the core layer 11, is dissolved.

As a result, the boundary portion between the inner side surface of the through-hole 11x and the second surface of the core layer 11 is chamfered so as to have a curved shape. Thus, a ring-shaped second chamfered portion is formed. For example, the second chamfered portion has a rounded convex shape in a sectional view taken parallel with the thickness direction of the core layer 11.

Figure 4A:
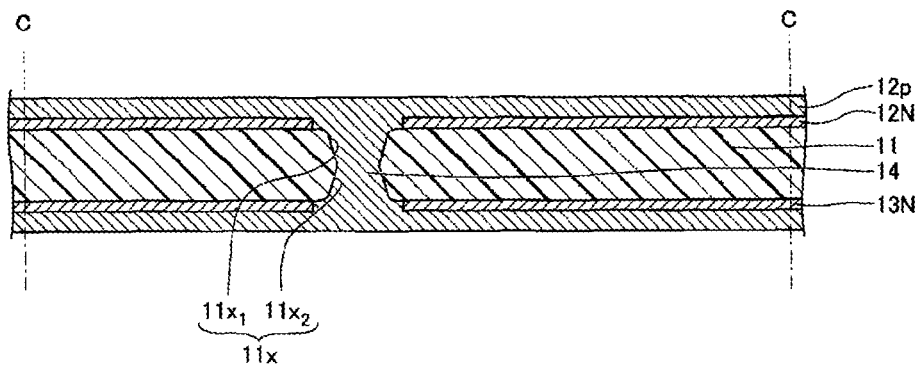
FIGS. 4A-4C are a third set of drawings illustrating a manufacturing process of the wiring board according to the embodiment.

Then, in a step shown in FIGS. 4A and 4B, wiring layers 12 and 13 are formed in the following manner. First, as shown in FIG. 4A, a metal layer 12p is formed so as to cover the first metal foil 12N, the first chamfered portion, the second metal foil 13N, and the second chamfered portion and to fill the through-hole 11x. The metal layer 12p is a layer to become a second metal layer 12b, a fourth metal layer 13b, and a through-hole wiring 14 when etched.

The metal layer 12p is formed in the following manner. A seed layer (not shown) is formed by, for example, electroless plating or sputtering so as to cover the first metal foil 12N, the first chamfered portion, the second metal foil 13N, the second chamfered portion, and the inner side surface of the through-hole 11x. A plating layer is formed on the seed layer by electrolytic plating using the seed layer as an electricity supply layer. As a result, a metal layer 12p is formed in which the plating layer is laid on the seed layer. The seed layer and the plating layer may be made of copper (Cu), for example.

Then, the first metal foil 12N, the second metal foil 13N, and the metal layer 12p are patterned, whereby wiring layers 12 and 13 are formed on the first surface and the second surface of the core layer 11, respectively. More specifically, this is done in the following manner. A first resist layer (not shown) is formed on the first surface of the metal layer 12p so as to cover portions to become a wiring layer 12. A second resist layer (not shown) is formed on the second surface of the metal layer 12p so as to cover portions to become a wiring layer 13. The portions of the metal layer 12p and the first metal foil 12N which are exposed through the first resist layer and the portions of the metal layer 12p and the second metal foil 12N which are exposed through the second resist layer are etched away.

Then, the first resist layer and the second resist layer are removed. As a result, as shown in FIG. 4B, a wiring layer 12 in which a second metal layer 12b is laid on a first metal layer 12a, a wiring layer 13 in which a fourth metal layer 13b is laid on a third metal layer 13a, and a through-hole wiring 14 which fills the through-hole 11x and electrically connects corresponding portions of the wiring layers 12 and 13 are formed.

More specifically, the wiring layer 12 is formed so as to include a ring-shaped portion, located outside the first chamfered portion, of the first metal layer 12a which has been formed by patterning the first metal foil 12N and a portion, laid on the first chamfered portion and the ring-shaped portion of the first metal layer 12a, of a second metal layer 12b which has been formed by patterning the metal layer 12p.

The wiring layer 13 is formed so as to include a ring-shaped portion, located outside the second chamfered portion, of the third metal layer 13a which has been formed by patterning the second metal foil 13N and a portion, laid on the second chamfered portion and the ring-shaped portion of the third metal layer 13a, of a fourth metal layer 13b which has been formed by patterning the metal layer 12p.

Figure 4B:
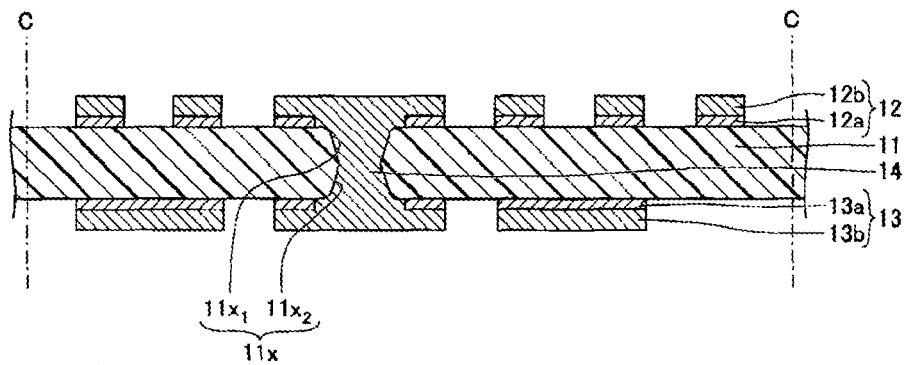
Figure 4C:
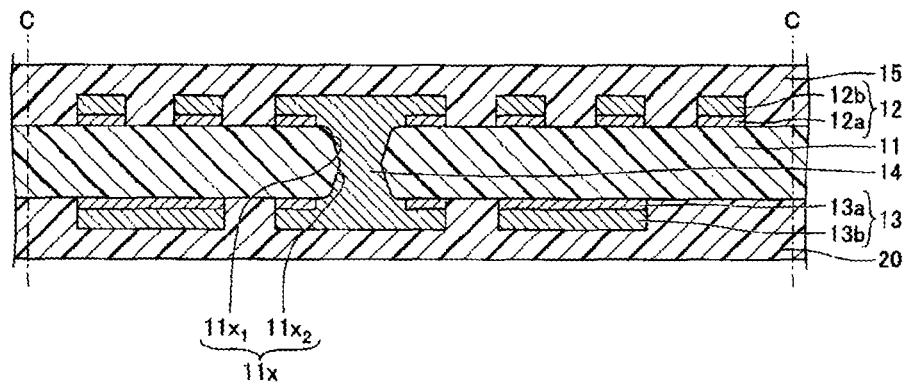

Then, in a step shown in FIG. 4C, an insulating layer 15 is formed by laminating a film-like epoxy resin or the like on the first surface of the core layer 11 so as to cover the wiring layer 12. An insulating layer 20 is formed by laminating a film-like epoxy resin or the like on the second surface of the core layer 11 so as to cover the wiring layer 13. Each of insulating layers 15 and 20 may be formed by applying and setting a liquid or paste epoxy resin or the like, instead of laminating a film-like epoxy resin or the like. Each of the insulating layers 15 and 20 may be about 15 to 35 µm, for example, in thickness. Each of the insulating layers 15 and 20 may contain a filler such as silica ($SiO_2$).

Figure 5A:
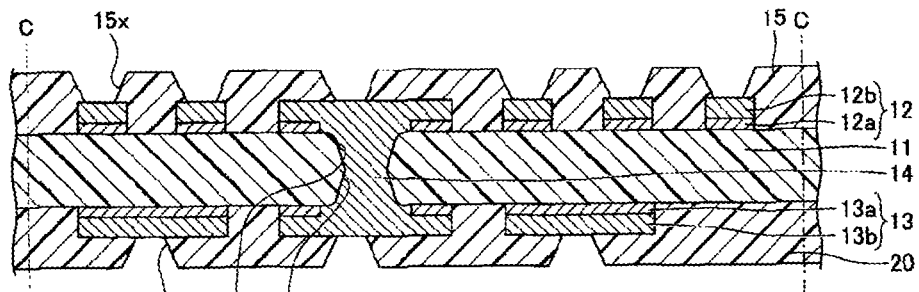
FIGS. 5A-5C are a fourth set of drawings illustrating a manufacturing process of the wiring board according to the embodiment.

Then, in a step shown in FIG. 5A, via holes 15x are formed so as to penetrate through the insulating layer 15 and expose respective portions of the first surface of the wiring layer 12. Via holes 20x are formed so as to penetrate through the insulating layer 20 and expose respective portions of the second surface of the wiring layer 13. The via holes 15x and 20x can be formed by laser processing using a $CO_2$ laser, for example. It is preferable that desmearing be performed after the formation of the via holes 15x and 20x to remove resin residues sticking to the surface portions, exposed at the bottoms of the via holes 15x and 20x, of the wiring layers 12 and 13.

Figure 5B:
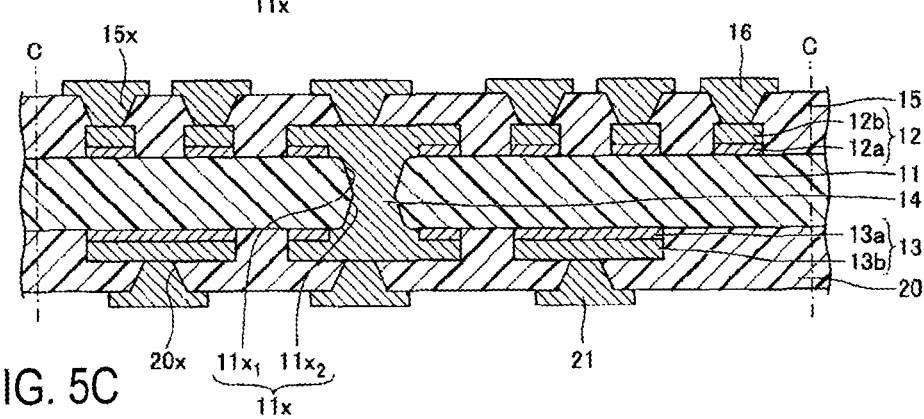

Then, at a step shown in FIG. 5B, a wiring layer 16 is formed on the first side of the insulating layer 15. The wiring layer 16 includes a plurality of vias that fill the respective via holes 15x and wiring patterns formed on the first surface of the insulating layer 15. Portions of the wiring layer 16 are electrically connected to the respective portions, exposed at the bottoms of the via holes 15x, of the wiring layer 12.

Likewise, a wiring layer 21 is formed on the second side of the insulating layer 20. The wiring layer 21 includes a plurality of vias that fill the respective via holes 20x and wiring patterns formed on the second surface of the insulating layer 20. Portions of the wiring layer 21 are electrically connected to the respective portions, exposed at the bottoms of the via holes 20x, of the wiring layer 13.

Each of the wiring layers 16 and 21 may be made of copper (Cu), for example, and may be about 10 to 30 µm, for example, in thickness. Each of the wiring layers 16 and 21 may be formed by any of various wiring forming methods such as a semi-additive method or a subtractive method.

Figure 5C:
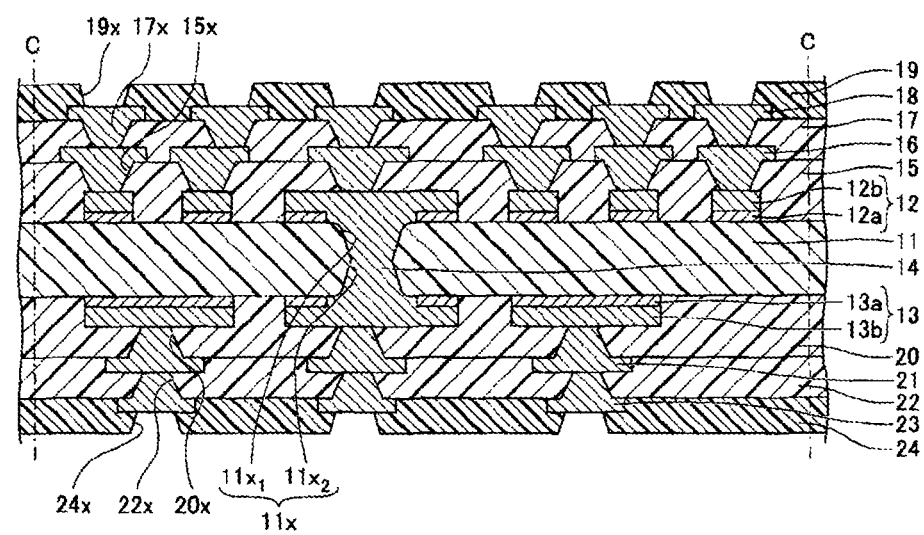

Then, in a step shown in FIG. 5C, an insulating layer 17, a wiring layer 18, and a solder resist layer 19 are laid sequentially on the wiring layer 16 and an insulating layer 22, a wiring layer 23, and a solder resist layer 24 are laid sequentially on the wiring layer 21 by executing steps that are similar to the steps shown in FIGS. 4C-5B. The numbers of wiring layers and insulating layers laid on each side may be an arbitrary number.

More specifically, an insulating layer 17 is formed on the first surface of the insulating layer 15 so as to cover the wiring layer 16. Likewise an insulating layer 22 is formed on the second surface of the insulating layer 20 so as to cover the wiring layer 21. Via holes 17x are formed so as to penetrate through the insulating layer 17 and expose respective portions of the first surface of the wiring layer 16. Likewise, via holes 22x are formed so as to penetrate through the insulating layer 22 and expose respective portions of the second surface of the wiring layer 21. The material and the thickness of each of the insulating layers 17 and 22 may be the same as those of the insulating layer 15. Each of the insulating layers 17 and 22 may contain a filler such as silica ($SiO_2$).

Then, a wiring layer 18 is formed on the first side of the insulating layer 17. The wiring layer 18 includes a plurality of vias that fill the respective via holes 17x and wiring patterns formed on the first surface of the insulating layer 17. Portions of the wiring layer 18 are electrically connected to the respective portions, exposed at the bottoms of the via holes 17x, of the wiring layer 16. Likewise, a wiring layer 23 is formed on the second side of the insulating layer 22. The wiring layer 23 includes a plurality of vias that fill the respective via holes 22x and wiring patterns formed on the second surface of the insulating layer 22. Portions of the wiring layer 23 are electrically connected to the respective portions, exposed at the bottoms of the via holes 22x, of the wiring layer 21. The material and the thickness of each of the wiring layers 18 and 23 may be the same as those of the wiring layer 16.

Then, a solder resist layer 19 is formed on the first surface of the insulating layer 17 so as to cover the wiring layer 18 (as mentioned above, the solder resist layer 19 may be formed so as to expose the wiring layer 18 completely). For example, the solder resist layer 19 can be formed by applying a liquid or paste photosensitive epoxy insulative resin on the first surface of the insulating layer 17 so as to cover the wiring layer 18 by screen printing, roll coating, spin coating, or the like. Alternatively, the solder resist layer 19 may be formed by laminating a film-like photosensitive epoxy insulative resin on the first surface of the insulating layer 17 so as to cover the wiring layer 18. Likewise, a solder resist layer 24 is formed on the second surface of the insulating layer 22 so as to cover the wiring layer 22.

Openings 19x are formed through the solder resist layer 19 by exposing to light and developing the applied or laminated insulative resin (photolithography). Openings 24x are formed through the solder resist layer 24 in the same manner (photolithography). Alternatively, the openings 19x and 24x may be formed by laser processing or blasting. The plan-view shape of each of the openings 19x and 24x may be circular, for example. The diameter of each of the openings 19x and 24x may be set according to the terminal pitch of a die or a mother board and other factors.

If necessary, a metal layer or the like may be formed on each portion, exposed at the bottom of an opening 19x or 24x, of the first surface of the wiring layer 18 and the second surface of the wiring layer 23 by electroless plating, for example. Examples of the metal layer are an Au layer, an Ni/Au layer (i.e., a metal layer formed by providing an Ni layer and an Au layer in this order), and an Ni/Pd/Au layer (i.e., a metal layer formed by providing an Ni layer, a Pd layer, and an Au layer in this order). Instead of forming a metal layer, an antioxidation treatment such as an OSP (organic solderability preservative) treatment may be performed on each portion, exposed at the bottom of an opening 19x or 24x, of the first surface of the wiring layer 18 and the second surface of the wiring layer 23.

Furthermore, external connection terminals such as solder balls or lead pins may be formed on the respective portions, exposed at the bottoms of the openings 19x and 24x, of the first surface of the wiring layer 18 and the second surface of the wiring layer 23. The external connection terminals serve as terminals for connections to a semiconductor chip (not shown) or a mounting board (not shown) such as a mother board. Alternatively, the portions themselves, exposed at the bottoms of the openings 19x and 24x, of the first surface of the wiring layer 18 and the second surface of the wiring layer 23 may used as external connection terminals.

The reason why the embodiment employs the lamination plate in which the metal foils are formed on the two respective surfaces of the core layer 11 is to increase the adhesion between each surface of the core layer 11 and wiring patterns formed thereon and thereby prevent disconnection or the like of the wiring patterns. Where what is called a glass epoxy substrate or the like is used as the core layer 11, asperities are formed in each surface of the core layer 11 because of the use of glass cloth. Therefore, if wiring patterns were formed by forming only a plating layer on each surface of the core layer 11, the plating layer could not follow the asperities properly and the adhesion between each surface of the core layer 11 and the wiring patterns formed thereon might be lowered, possibly resulting in disconnection or the like of wiring patterns. In view of the above, in the embodiment, the lamination plate in which the metal foils are formed on the two respective surfaces of the core layer 11 is used and wiring patterns are formed by forming plating layers on the two respective metal foils. Since no asperities due to glass cloth are formed in the surfaces of the metal foils, the wiring patterns are formed on the metal foils with high adhesion. In this manner, highly reliable wiring patterns which are free of risk of disconnection can be formed.

Figure 6:
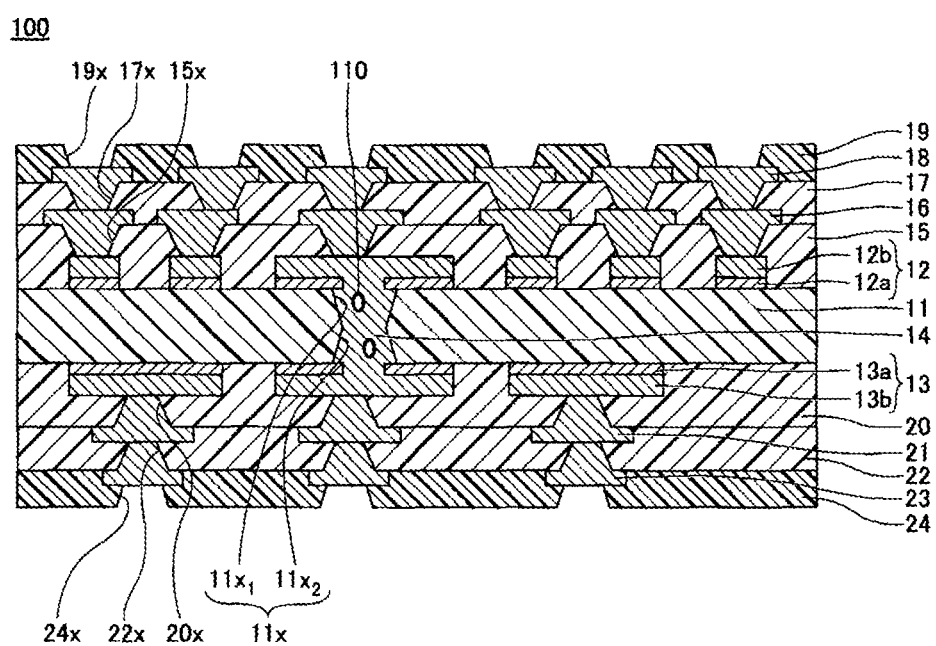
FIG. 6 is a sectional view illustrating a wiring board of a comparative example.

Advantages of the embodiment will now be described using a comparative example. FIG. 6 is a sectional view illustrating a wiring board 100 of a comparative example. As shown in FIG. 6, the wiring board 100 of the comparative example is different from the wiring board 10 according to the embodiment shown in FIGS. 1A and 1B in that burrs project inward like a visor from the end of the first metal layer 12a at the first-side open end of the through-hole 11x and from the end of the third metal layer 13a at the second-side open end of the through-hole 11x. That is, the wiring board 100 is manufactured without executing the step shown in FIG. 3A.

If the step shown in FIGS. 4A and 4B is performed (i.e., plating is performed) without executing the step shown in FIG. 3A (i.e., without removing the burrs), as shown in FIG. 6 voids 110 are formed in the through-hole wiring 14. The voids 110 are formed because if plating is performed without removing the burrs, metal deposits first on the burrs and hence the plating liquid is not supplied to inside the through-hole 11x sufficiently.

Plating liquid remains in the voids 110. This causes the occurrence of disconnection or the like in the wiring layer 12 or 13 or the through-hole wiring 14. This also causes the occurrence of disconnection or the like at the connection interface between the wiring layer 12 and the corresponding via of the wiring layer 16 or at the connection interface between the wiring layer 13 and the corresponding via of the wiring layer 21. This disconnection or the like lowers the reliability of the wiring board 100.

The wiring board 10 according to the embodiment is free of the above problem because plating is performed in the step shown in FIGS. 4A and 4B after the burrs were removed in the step shown in FIG. 3A and hence the plating liquid is supplied to inside the through-hole 11x sufficiently.

As described above, unlike in the related-art manufacturing method of a wiring board, the embodiment does not have a step of forming openings in the first metal foil 12M and the second metal foil 13M formed on the two respective surfaces of the core layer 1 before the through-hole 11x is formed through the core layer 11. That is, the embodiment does not require complicated steps of, for example, forming photosensitive resist layers on the first metal foil 12M and the second metal foil 13M and exposing to light and developing the resist layers, as a result of which the manufacturing cost of the wiring board 10 can be reduced.

Since the through-hole 11x is formed by applying laser light to the core layer 11 through the first metal foil 12M and the second metal foil 13M, that is, without forming openings through the first metal foil 12M and the second metal foil 13M, burrs project inward like a visor at the first-side open end and the second-side open end of the through-hole 11x. However, since plating for filling the through-hole 11x is performed after the burrs are removed, the plating liquid can be supplied to inside the through-hole 11x and hence no voids are formed in the through-hole 11x. As a result, the reliability of the wiring board 10 is increased. Although the step of removing the burrs is added, in this step the burrs are removed by etching without forming a resist layer or the like as a mask unlike the above-mentioned complicated steps of the related-art manufacturing method of a wiring board. Thus, the addition of this step has only a small influence on the manufacturing cost of the wiring board 10.

In the step of forming the through-hole 11x, burrs may be formed in such a manner that their end portions are bent or laser-light-melted fragments of the first metal foil 12N or the second metal foil 13N stick to their end portions. However, such burrs can be removed by the burr-removing step. Therefore, no asperities are formed in the surfaces of the plating layer, whereby the insulation between layers can be enhanced and wiring layers can be formed stably.

The manufacturing method of the wiring board 10 according to the embodiment has the step of thinning the first metal foil 12M or the second metal foil 13M into the first metal foil 12N or the second metal foil 13N. Whereas it is difficult to form fine wiring patterns from the first metal foil 12M or the second metal foil 13M which are not thinned, the use of the thinned first metal foil 12N or second metal foil 13N facilitates formation of fine wiring patterns. The formation of fine wiring patterns makes it possible to miniaturize the wiring board 10. A semiconductor package can be miniaturized which is produced by mounting a semiconductor chip on the wiring board 10.

The curved chamfered portion (first chamfered portion) is formed in ring form in the boundary portion between the inner side surface of the through-hole 11x and the first surface of the core layer 11, and the ring-shaped portion of the first metal layer 12a is formed outside the first chamfered portion. At the first chamfered portion, the second metal layer 12b is in direct contact with the first surface of the core layer 11. Likewise, the curved chamfered portion (second chamfered portion) is formed in ring form in the boundary portion between the inner side surface of the through-hole 11x and the second surface of the core layer 11, and the ring-shaped portion of the third metal layer 13a is formed outside the second chamfered portion. At the second chamfered portion, the fourth metal layer 13b is in direct contact with the second surface of the core layer 11.

As described above, asperities are formed in both surfaces of the core layer 11 because of the use of glass cloth. Therefore, the connection reliability (adhesion) is not high in the region where the second metal layer 12b is in direct contact with the first surface of the core layer 11 and in the region where the fourth metal layer 13b is in direct contact with the second surface of the core layer 11. However, in the embodiment, the ring-shaped portion of the first metal layer 12a is formed outside the region where the second metal layer 12b is in direct contact with the first surface of the core layer 11, and the ring-shaped portion of the third metal layer 13a is formed outside the region where the fourth metal layer 13b is in direct contact with the second surface of the core layer 11.

That is, there exist the region where the second metal layer 12b is in contact with the core layer 11 via the first metal layer 12a and the region where the fourth metal layer 13b is in contact with the core layer 11 via the third metal layer 13a. As a result, high connection reliability (adhesion) between the core layer 11 and the wiring layers can also be secured in the vicinity of the through-hole 11x.

Because of the formation of the first chamfered portion and the second chamfered portion, the probability of occurrence of a crack in the wiring layer 12 or 13 or the through-hole wiring 14 is lowered because stress concentration from the first chamfered portion or the second chamfered portion is not prone to occur. The probability of occurrence of an event that the wiring layer 12 or 13 or the through-hole wiring 14 is disconnected starting from a crack is lowered.

Modification of Embodiment

Figure 7A:
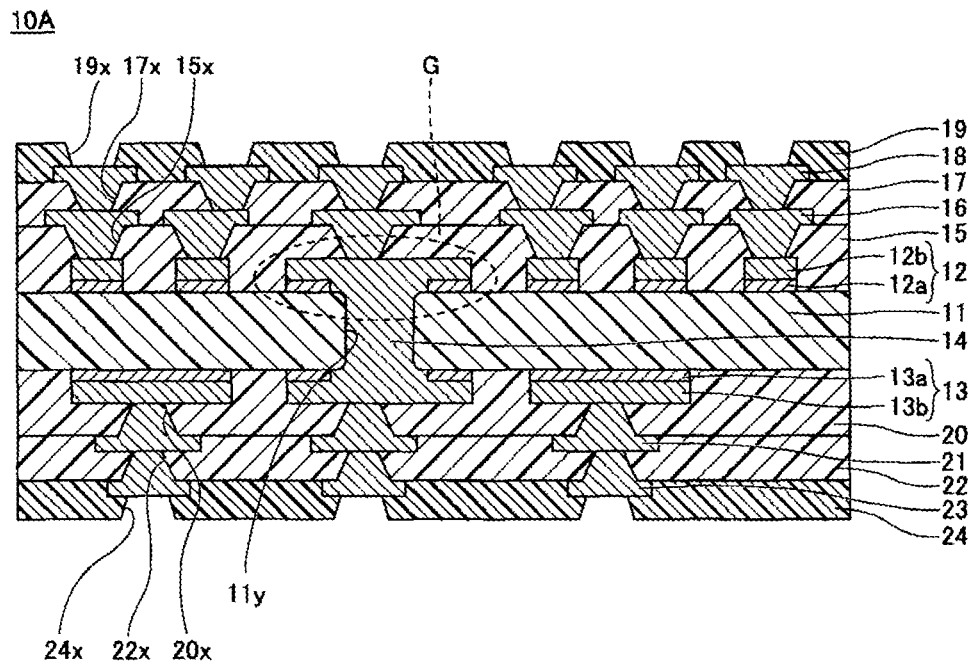
FIGS. 7A and 7B are sectional views illustrating a wiring board according to a modification of the embodiment.
Figure 7B:
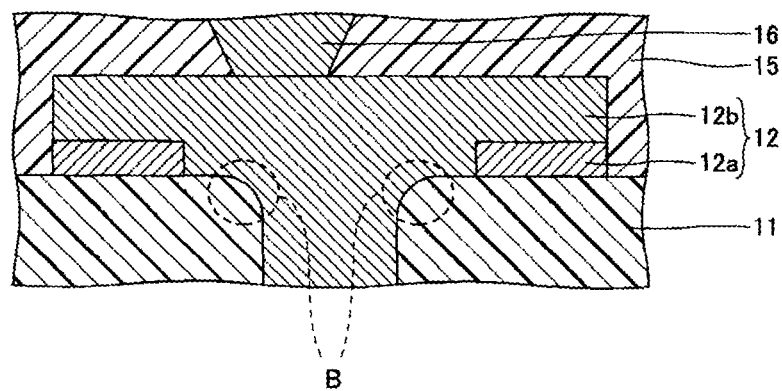

A modification of the embodiment relates to a wiring board in which the shape of the through-hole in which the through-hole wiring is formed is different than in the embodiment. In the modification of the embodiment, the same constituent members as in the above-described embodiment will not be described in detail. FIGS. 7A and 7B are sectional views illustrating a wiring board 10A according to the modification of the embodiment. FIG. 7B is an enlarged view of part G of FIG. 7A.

As shown in FIGS. 7A and 7B, the wiring board 10A according to the modification of the embodiment is different from the wiring board 10 according to the embodiment shown in FIGS. 1A and 1B in that the through-hole 11y replaces the through-hole 11x. The through-hole 11y is a through-hole that penetrates in the thickness direction of the core layer 11 and is circular in a plan view. The area of the cross section taken parallel with the surfaces of the core layer 11 is approximately constant irrespective of the position in the thickness direction of the core layer 11. However, the through-hole 11y may have an elliptical or some other plan-view shape as long as the area of the cross section taken parallel with the surfaces of the core layer 11 is approximately constant irrespective of the position in the thickness direction of the core layer 11.

The wiring board 10A is manufactured in the following manner. First, the steps shown in FIGS. 2A and 2B are executed. Then, a through-hole 11y is formed by applying laser light to the core layer 11 from the first side through the surface-treated layer 101 and the first metal foil 12N. Alternatively, a through-hole 11y may be formed by applying laser light to the core layer 11 from its second side through the surface-treated layer 102 and the first metal foil 13N.

That is, a through-hole 11y is formed by applying laser light to the core layer 11 from its one side. A through-hole 11y whose area of the cross section taken parallel with the surfaces of the core layer 11 is approximately constant irrespective of the position in the thickness direction of the core layer 11 can be formed by applying laser light that is made close to parallel light by a collimator lens or the like.

As in the step shown in FIG. 2C of the embodiment, burrs project inward like a visor from the ends of the surface-treated layer 101 and the first metal foil 12N at the first-side open end of the through-hole 11y or from the ends of the surface-treated layer 102 and the second metal foil 13N at the second-side open end of the through-hole 11x. Then, the steps shown in FIGS. 3A and 3B to FIGS. 5A-5C of the embodiment are executed, whereby a wiring board 10A is completed (see FIGS. 7A and 7B).

As described above, burrs are formed as in the embodiment also in the case where a through-hole 11y whose area of the cross section taken parallel with the surfaces of the core layer 11 is approximately constant irrespective of the position in the thickness direction of the core layer 11 is formed by applying laser light to the core layer 11 from its one side. However, since plating is performed in the same manner as in the step shown in FIG. 4A after the burrs are removed in the same manner as in the step shown in FIG. 3A, the plating liquid can be supplied to inside the through-hole 11y sufficiently, as a result of which the same advantages as in the embodiment are obtained.

Instead of applying laser light to the core layer 11 from its one side, a through-hole 11y may be formed mechanically (e.g., using a drill). Also in this case, a through-hole 11y is formed whose area of the cross section taken parallel with the surfaces of the core layer 11 is approximately constant irrespective of the position in the thickness direction of the core layer 11 and burrs are formed as in the first embodiment. However, since plating is performed in the same manner as in the step shown in FIG. 4A after the burrs are removed in the same manner as in the step shown in FIG. 3A, the plating liquid can be supplied to inside the through-hole 11y sufficiently, as a result of which the same advantages as in the embodiment are obtained.

Application Example of Embodiment

An application example of the embodiment will be described below which relates to a semiconductor package in which a semiconductor chip is mounted on the wiring board 10 according to the embodiment. In the application example of the embodiment, the same constituent members as in the above-described embodiment will not be described in detail.

Figure 8:
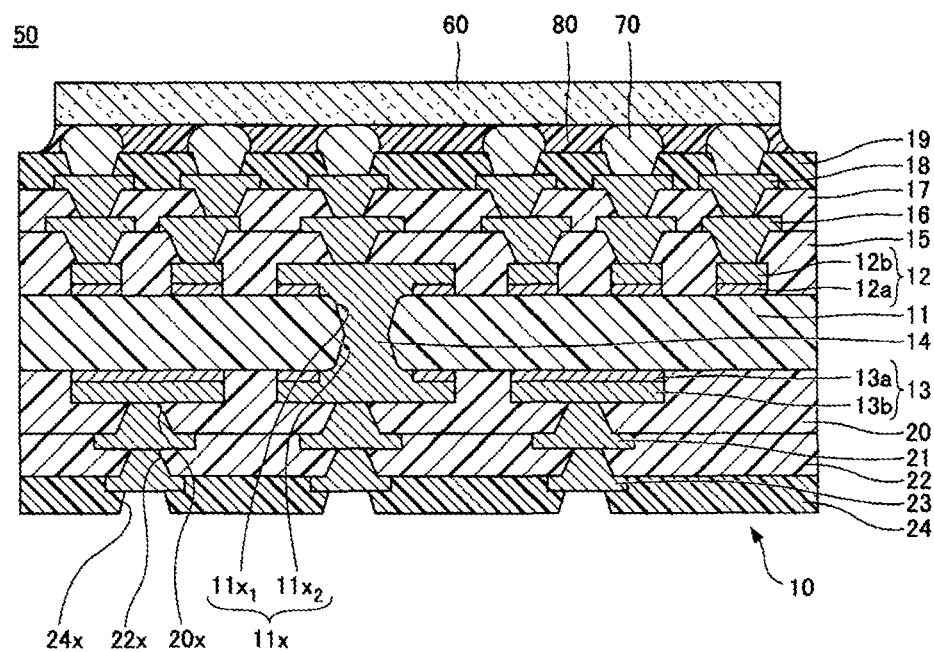
FIG. 8 is a sectional view illustrating a semiconductor package of an application example of the embodiment.

FIG. 8 is a sectional view illustrating a semiconductor package 50 of the application example of the embodiment. As shown in FIG. 8, the semiconductor package 50 has the wiring board 10 shown in FIGS. 1A and 1B, a semiconductor chip 60, bumps 70, and an underfill resin layer 80.

For example, the semiconductor chip 60 is a one in which a semiconductor integrated circuit etc. (not shown) are formed on a thinned semiconductor substrate (not shown) made of silicon or the like. Electrode pads (not shown) are formed on the semiconductor substrate so as to be electrically connected to the semiconductor integrated circuit.

The bumps 70, which are solder bumps, for example, connect the electrode pads of the semiconductor chip 60 to the first pads 18 of the wiring board 10. Example materials of the solder bumps are an alloy containing Pb, an alloy of Sn and Cu, an alloy of Sn and Ag, and an alloy of Sn, Ag, and Cu. The underfill resin layer 80 fills the space between the semiconductor chip 60 and the first surface of the wiring board 10.

As described above, a semiconductor package can be implemented by mounting a semiconductor chip on the wiring board 10 according to the embodiment.

Various aspects of the subject-matter described herein are set out non-exhaustively in the following numbered clauses:

1. A method of manufacturing a wiring board, comprising:

preparing a lamination plate which has a core layer and a first metal foil formed on a first surface of the core layer, and forming a through-hole which penetrates through the core layer and the first metal foil;

removing a burr that projects from an end of the first metal foil toward the through-hole, and exposing a portion of the first surface of the core layer around an open end of the through-hole;

after the portion is exposed, forming a metal layer in such a manner that the metal layer covers the first metal foil and fills the through-hole; and forming a first wiring layer on the first surface of the core layer by patterning the first metal foil and the metal layer.

2. The manufacturing method of a wiring board according to clause 1, further comprising:

after the portion is exposed, removing resin residues sticking to an inner side surface of the through-hole, and forming a curved first chamfered portion by chamfering a boundary portion between the inner side surface of the through-hole and the first surface of the core layer, wherein the metal layer is formed in such a manner that the metal layer covers the first metal foil and the first chamfered portion and fills the through-hole.

3. The manufacturing method of a wiring board according to clause 2, wherein the first wiring layer is formed so as to include a first metal layer which is formed outside the first chamfered portion on the first surface of the core layer through patterning of the first metal foil and a second metal layer which is formed on the first chamfered portion and the first metal layer through patterning of the metal layer.

4. The manufacturing method of a wiring board according to clause 3, wherein the exposed portion of the first surface of the core layer has a ring shape, the first chamfered portion has a ring shape, and the first metal layer has a ring shape.

5. The manufacturing method of a wiring board according to clause 1, wherein:
the lamination plate has the core layer, the first metal foil formed on the first surface of the core layer, and a second metal foil formed on a second surface of the core layer,
the through-hole is formed so as to penetrate through the core layer, the first metal foil, and the second metal foil, and
the metal layer is formed in such a manner that the metal layer covers the first metal foil, and the second metal foil and fills the through-hole, and
the manufacturing method further comprises:
before the metal layer is formed, removing a burr that projects from an end of the second metal foil toward the through-hole, and exposing a portion of the second surface of the core layer around an open end of the through-hole; and
forming a second wiring layer on the second surface of the core layer by patterning the second metal foil and the metal layer.

6. The manufacturing method of a wiring board according to clause 5, further comprising:
forming a curved second chamfered portion by chamfering a boundary portion between the inner side surface of the through-hole and the second surface of the core layer,
the metal layer is formed in such a manner that the metal layer covers the first metal foil, the first chamfered portion, the second metal foil and the second chamfered portion and fills the through-hole.

7. The manufacturing method of a wiring board according to clause 5, wherein the second wiring layer is formed so as to include a third metal layer which is formed outside the second chamfered portion on the second surface of the core layer through patterning of the second metal foil and a fourth metal layer which is formed on the second chamfered portion and the third metal layer through patterning of the metal layer.

8. The manufacturing method of a wiring board according to clause 7, wherein the exposed portion of the second surface of the core layer has a ring shape, the second chamfered portion has a ring shape, and the third metal layer has a ring shape.

9. The manufacturing method of a wiring board according to any one of clauses 1 to 8, wherein the through-hole is formed after thinning the first metal foil.

10. The manufacturing method of a wiring board according to clause 9, wherein the through-hole is formed by thinning the first metal foil, forming a surface-treated layer on the thinned first metal foil, and applying laser light to the core layer through the surface-treated layer and the thinned first metal foil.

11. The manufacturing method of a wiring board according to clause 1, wherein:
the through-hole has a first hole and a second hole,
the first hole is a truncated-cone-shaped hole in which an open end located on the side of the first surface of the core layer is larger in area than a narrower end located in the core layer,
the second hole is a truncated-cone-shaped hole in which an open end located on the side of the second surface of the core layer is larger in area than a narrower end located in the core layer, and
the through-hole is formed in such a manner that the narrower ends of the first hole and second hole are connected to each other inside the core layer.

While certain embodiments have been described, these embodiments have been presented by way of example only, and are not intended to limit the scope of the invention. Indeed, the novel device and method described herein may be embodied in a variety of other forms; furthermore, various omissions, substitutions and changes in the form of the device and method, described herein may be made without departing from the sprit of the invention. The accompanying claims and their equivalents are intended to cover such forms or modifications as would fall within the scope and sprit of the invention.

What is claimed is:

1. A wiring board comprising:
a core layer;
a through-hole penetrating through the core layer in its thickness direction;
a first wiring layer formed on a first surface of the core layer;
a through-hole wiring formed in the through-hole and electrically connected to the first wiring layer;
a curved first chamfered portion formed in a boundary portion between an inner side surface of the through-hole and the first surface of the core layer, the first chamfered portion having a rounded convex shape;
a second wiring layer formed on a second surface of the core layer and electrically connected to the first wiring layer by the through-hole wiring; and
a curved second chamfered portion formed in a boundary portion between the inner side surface of the through-hole and the second surface of the core layer, the second chamfered portion having a rounded convex shape,
wherein the first wiring layer includes a first metal layer formed outside the first chamfered portion on the first surface of the core layer and a second metal layer formed on the first chamfered portion and the first metal layer, and the second wiring layer includes a third metal layer formed outside the second chamfered portion on the second surface of the core layer and a fourth metal layer formed on the second chamfered portion and the third metal layer.

2. The wiring board according to claim 1, wherein the first chamfered portion has a ring shape, and the first metal layer has a ring shape.

3. The wiring board according to claim 1, wherein the second chamfered portion has a ring shape, and the third metal layer has a ring shape.

4. A wiring board comprising:
a core layer;
a through-hole penetrating through the core layer in its thickness direction;
a first wiring layer formed on a first surface of the core layer;
a through-hole wiring formed in the through-hole and electrically connected to the first wiring layer;
a curved first chamfered portion formed in a boundary portion between an inner side surface of the through-hole and the first surface of the core layer;
a second wiring layer formed on a second surface of the core layer and electrically connected to the first wiring layer by the through-hole wiring; and a curved second chamfered portion formed in a boundary portion between the inner side surface of the through-hole and the second surface of the core layer, wherein:

the first wiring layer includes a first metal layer formed outside the first chamfered portion on the first surface of the core layer and a second metal layer formed on the first chamfered portion and the first metal layer, the second wiring layer includes a third metal layer formed outside the second chamfered portion on the second surface of the core layer and a fourth metal layer formed on the second chamfered portion and the third metal layer, the through-hole has a first hole and a second hole, the first hole and the second hole both being disposed between the first and second chamfered portions, the first hole is a truncated-cone-shaped hole in which an open end located on the side of the first surface of the core layer is larger in area than a narrower end located in the core layer, the second hole is a truncated-cone-shaped hole in which an open end located on the side of the second surface of the core layer is larger in area than a narrower end located in the core layer, the through-hole is formed in such a manner that the narrower ends of the first hole and second hole are connected to each other inside the core layer, and the first chamfered portion has a rounded convex shape, and the second chamfered portion has a rounded convex shape.

5. The wiring board according to claim 1, wherein:

the through-hole has a first hole and a second hole, the first hole is a truncated-cone-shaped hole in which an open end located on the side of the first surface of the core layer is larger in area than a narrower end located in the core layer, the second hole is a truncated-cone-shaped hole in which an open end located on the side of the second surface of the core layer is larger in area than a narrower end located in the core layer, and the through-hole is formed in such a manner that the narrower ends of the first hole and second hole are connected to each other inside the core layer.

\* \* \* \* \*